(12) United States Patent
Chun et al.

(10) Patent No.: US 7,510,891 B2
(45) Date of Patent: Mar. 31, 2009

(54) ORGANIC LIGHT EMITTING DISPLAY DEVICE AND METHOD OF MANUFACTURING THE SAME

(75) Inventors: Pil-Geun Chun, Suwon-si (KR); Eun-Ah Kim, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 190 days.

(21) Appl. No.: 11/586,167

(22) Filed: Oct. 24, 2006

(65) Prior Publication Data

US 2007/0111369 A1    May 17, 2007

(30) Foreign Application Priority Data

Nov. 12, 2005   (KR) ............... 10-2005-0108287

(51) Int. Cl.
*H01L 21/00* (2006.01)
(52) U.S. Cl. .................. 438/29; 438/22; 438/34; 438/38; 438/39; 438/40; 438/42; 438/43
(58) Field of Classification Search ............ 438/22, 438/29, 34, 38–40, 42–43
See application file for complete search history.

(56) References Cited

U.S. PATENT DOCUMENTS

2005/0173709 A1* 8/2005 Lee et al. ................. 257/79
2006/0033099 A1* 2/2006 Chung et al. .............. 257/40
2006/0046334 A1* 3/2006 Yamazaki et al. .......... 438/29

FOREIGN PATENT DOCUMENTS

KR   10-2005-0099026    10/2005

* cited by examiner

*Primary Examiner*—Zandra Smith
*Assistant Examiner*—Bac H Au
(74) *Attorney, Agent, or Firm*—Knobbe, Martens, Olson & Bear, LLP

(57) ABSTRACT

A method of manufacturing an organic light emitting display device and the organic light emitting display device which reduces generation of dark spots by particles are disclosed. The method of manufacturing an organic light emitting display device includes: preparing for a substrate including a pixel circuit; forming a pixel electrode layer on the substrate, the pixel electrode layer including a reflection film and being electrically connected to the pixel circuit; coating photoresist on the pixel electrode layer; exposing and developing the photoresist using a predetermined pattern to expose a portion of the pixel electrode layer; etching the exposed portion of the pixel electrode layer to form a pixel electrode electrically connected to the pixel circuit; covering the substrate and the photoresist remaining on the pixel electrode with an insulation film; patterning the insulation film to expose the photoresist remaining on the pixel electrode; removing the exposed photoresist to expose the pixel electrode; and sequentially forming an organic light emitting layer and a facing electrode on the pixel electrode.

12 Claims, 7 Drawing Sheets

ORGANIC LIGHT EMITTING DISPLAY DEVICE AND METHOD OF MANUFACTURING THE SAME

CROSS-REFERENCE TO RELATED APPLICATIONS

This application claims the benefit of Korean Patent Application No. 10-2005-0108287, filed on Nov. 12, 2005, in the Korean Intellectual Property Office, the disclosure of which is incorporated herein in its entirety by reference.

BACKGROUND OF THE INVENTION

1. Field of the Invention

The present invention relates to a method of manufacturing an organic light emitting display device and the organic light emitting display device. More particularly, the present invention relates to a method of manufacturing an organic light emitting display device and the organic light emitting display device, by which generation of dark spots by particles of a reflection film can be reduced.

2. Description of the Related Technology

Active matrix (AM) organic light emitting display devices (OLED) include an array of pixels. Each pixel includes a pixel circuit for driving an organic light emitting diode therein. The pixel circuit is electrically connected to a scan line, a data line, and a power supply line, and includes a thin film transistor (TFT) and a storage capacitor. The organic light emitting diode includes an anode, a cathode, and an organic light emitting layer interposed therebetween. The anode is typically formed of ITO film. The OLED further includes an encapsulating plate which covers the array of pixels.

Top-emission AM organic light emitting display devices typically display an image through the encapsulating plate. In the top-emission devices, the anode may further include a reflection film interposed between two ITO layers. However, since the reflection film is typically formed of an easily oxidizable metal, such as, Al, Mg, or Ag, an oxidized film is easily formed between the reflection film and the ITO film during formation of a hole to contact a driving thin film transistor (TFT) and the ITO film. The oxidized film increases the resistance of the ITO film and degrades the contact of the ITO film with the driving TFT.

In addition, the reflection film generates many particles while being manufactured, thus causing an electrical short between the anode and the cathode of the organic light emitting diode.

FIG. 1 is a photograph of a portion of an organic light emitting display device in which an electrical short occurred. In FIG. 1, a white layer which is the second from the bottom is an anode structure formed of ITO/Ag/ITO. A black layer immediately on the white layer is an organic emission layer (EL). A white thin layer right on the black layer is a semitransparent cathode. As shown in FIG. 1, particles exist on the ITO/Ag/ITO anode structure, shorting the anode structure and the cathode. According to an element analysis, the particles are Ag. In other words, the particles are produced during formation of the reflection film.

The short due to the particles produces a dark spot on the displayed image. Accordingly, pixels including the dark spots become inferior. The number of dark spots produced by particles of a reflection film is at least 100 times greater than that of dark spots produced by particles of the ITO layer.

SUMMARY OF CERTAIN INVENTIVE ASPECTS

One aspect of the invention provides a method of manufacturing an organic light emitting display device. The method comprises: forming a conductive layer over a substrate; forming a photoresist layer over the conductive layer; patterning the photoresist layer so as to expose at least a portion of the conductive layer; etching the exposed portion of the conductive layer through the patterned photoresist layer, thereby defining a first electrode; forming an insulating layer over the substrate and the patterned photoresist layer, wherein the patterned photoresist layer remains over the first electrode; patterning the insulating layer to expose at least a portion of the patterned photoresist layer remaining over the first electrode; removing the at least a portion of the patterned photoresist layer to expose at least a portion of the first electrode; forming an organic light emitting layer over the first electrode; and forming a second electrode over the organic light emitting layer.

The conductive layer may comprise a reflection film. The reflection film may be formed of a metallic material. The metallic material may be selected from the group consisting of Ag, Mg, Al, Pt, Pd, Au, Ni, Nd, Ir, Cr, Li, and Ca. The conductive layer may further comprise a transparent conductive layer. The transparent conductive layer may be formed of a material selected from the group consisting of ITO, IZO, $In_2O_3$, and ZnO.

Removing the at least a portion of the patterned photoresist layer may comprise leaving another portion of the patterned photoresist layer to remain over the first electrode, the other portion having a top surface covered with the insulating layer. The other portion may overlie an edge portion of the first electrode.

Patterning the photoresist layer may comprise tapering the photoresist layer from top to bottom. Patterning the insulating layer may comprise exposing substantially the entire portion of the patterned photoresist layer remaining over the first electrode. Removing the at least a portion of the patterned photoresist layer may comprise removing substantially the entire portion of the patterned photoresist layer.

Another aspect of the invention provides an organic light emitting display device made by the method described above.

Yet another aspect of the invention provides an organic light emitting display device (OLED), comprising: a first electrode formed over a substrate; an organic light emitting layer comprising a portion formed over a first portion of the first electrode; a photoresist formed over a second portion of the first electrode, the second portion surrounding at least part of the first portion; and a second electrode formed over the pixel defining layer and the organic light emitting layer.

The OLED may further comprise a pixel defining layer formed over the substrate while substantially surrounding the first electrode and the photoresist. The pixel defining layer may further comprise a portion formed over the photoresist. The organic light emitting layer may further comprise a portion interposed between the pixel defining layer and the second electrode. The organic light emitting layer may further comprise a portion interposed between the photoresist and the second electrode.

The first electrode may comprise a reflection film. The reflection film may be formed of a metallic material. The metallic material may be selected from the group consisting of Ag, Mg, Al, Pt, Pd, Au, Ni, Nd, Ir, Cr, Li, and Ca. The first electrode may comprise a transparent conductor layer, a reflective conductor layer, and a transparent conductor layer sequentially stacked over one another.

Another aspect of the invention provides a method of manufacturing an organic light emitting display device and the organic light emitting display device, by which generation of dark spots by particles can be reduced.

Another aspect of the invention provides a method of manufacturing an organic light emitting display device, comprising: preparing for a substrate including a pixel circuit; forming a pixel electrode layer on the substrate, the pixel electrode layer including a reflection film and being electrically connected to the pixel circuit; coating photoresist on the pixel electrode layer; exposing and developing the photoresist using a predetermined pattern to expose a portion of the pixel electrode layer; etching the exposed portion of the pixel electrode layer to form a pixel electrode electrically connected to the pixel circuit; covering the substrate and the photoresist remaining on the pixel electrode with an insulation film; patterning the insulation film to expose the photoresist remaining on the pixel electrode; removing the exposed photoresist to expose the pixel electrode; and sequentially forming an organic light emitting layer and a facing electrode on the pixel electrode.

Yet another aspect of the invention provides a organic light emitting display device comprising: a substrate including a pixel circuit; a pixel electrode formed on the substrate, the pixel electrode layer including a reflection film and being electrically connected to the pixel circuit; photoresist with which edges of the pixel electrode are covered; an insulation film covering the substrate and the photoresist and exposing the pixel electrode; an organic light emitting layer formed on at least the exposed pixel electrode; and a facing electrode formed on the insulation film and the organic light emitting layer.

BRIEF DESCRIPTION OF THE DRAWINGS

The above and other aspects of the invention will become more apparent by describing in detail exemplary embodiments thereof with reference to the attached drawings in which.

DETAILED DESCRIPTION OF CERTAIN INVENTIVE EMBODIMENTS

Figure 1:
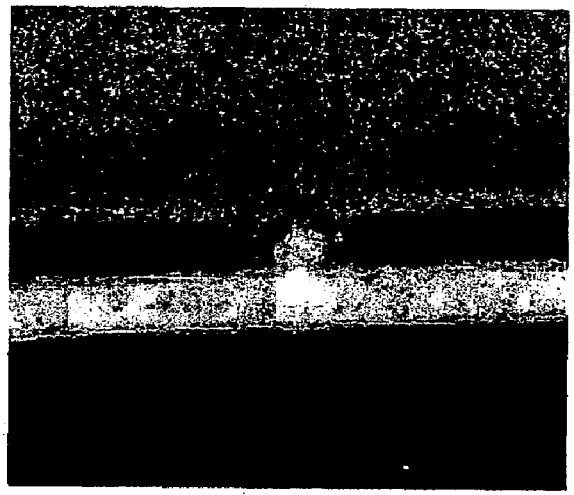
FIG. 1 is a photograph of a cross-section of an organic light emitting display device having a dark spot produced by particles of a reflection film.

Certain embodiments will now be described with reference to the accompanying drawings. In the drawings, like reference numerals indicate identical or functionally similar elements.

Figure 2:
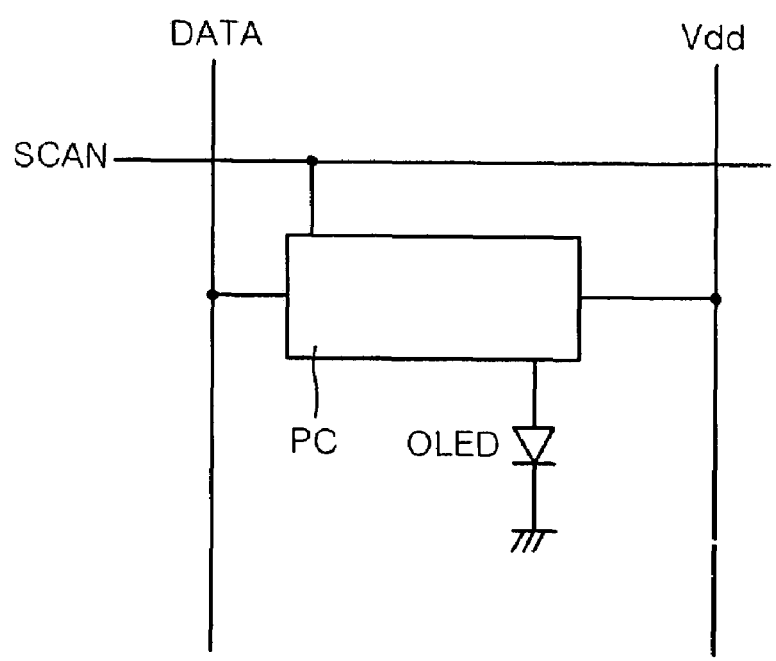
FIG. 2 is a schematic circuit diagram of a pixel circuit used in an organic light emitting display device according to one embodiment.

FIG. 2 is a schematic circuit diagram of a pixel circuit (PC) used in an organic light emitting display device according to one embodiment. As shown in FIG. 2, each pixel is provided with a data line DATA, a scan line SCAN, and a Vdd power line Vdd. The Vdd power line Vdd supplies driving power to an organic light-emitting diode (OLED). The pixel circuit of each pixel is electrically connected to the data line DATA, the scan line SCAN, and the Vdd power line Vdd and controls the light emission of the OLED.

Figure 3:
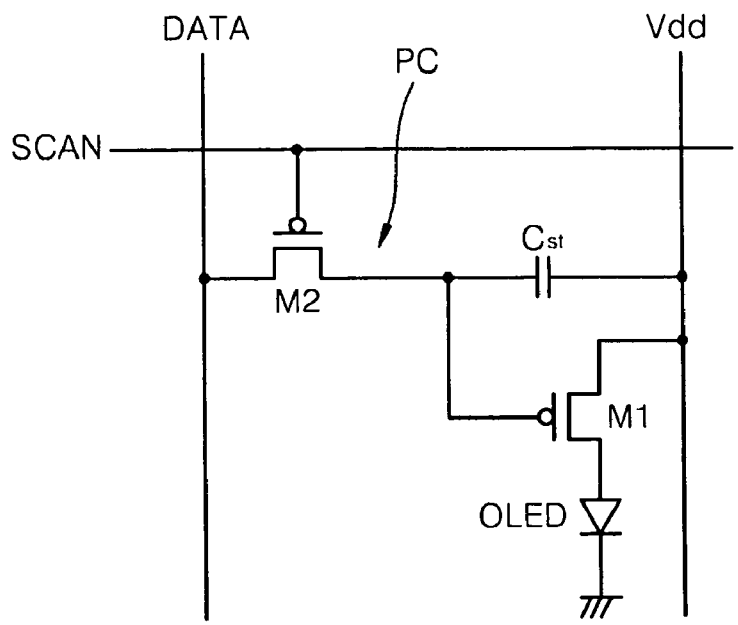
FIG. 3 is a circuit diagram showing the pixel circuit of FIG. 2.

FIG. 3 is a circuit diagram showing the pixel circuit of FIG. 2 in greater detail. The pixel circuit includes two thin film transistors (TFTs) M1 and M2 and a single storage capacitor Cst. Referring to FIG. 3, each pixel of the organic light emitting display device includes at least two thin film transistors (for example, the switching TFT M2 and the driving TFT M1), the storage capacitor Cst, and the OLED.

The switching TFT M2 is turned on/off by a scan signal transmitted through the scan line SCAN and delivers a data signal transmitted from the data line DATA to the storage capacitor Cst and the driving TFT M1. In the illustrated embodiment, the switching TFT M2 is included as a switching device as shown in FIG. 3. In other embodiments, a switching circuit including a plurality of TFTs and a capacitor may be included. The pixel of FIG. 2 may further include a circuit which compensates for a threshold voltage (Vth) value of the driving TFT M1 or a circuit which compensates for a voltage drop of the driving power supply Vdd.

The driving TFT M1 determines the amount of current flowing into the OLED, according to the data signal transmitted through the switching TFT M2. The storage capacitor Cst stores the data signal transmitted through the switching TFT M2 for one frame.

The illustrated driving TFT M1 and the switching TFT M2 are PMOS TFTs. In other embodiments, at least one of the driving TFT M1 and the switching TFT M2 may be implemented as an NMOS TFT. In addition, the number of TFTs and the number of capacitors are not limited to those illustrated in FIG. 3. In other embodiments, a greater number of TFTs and a greater number of capacitors than the numbers illustrated in FIG. 3 may be included.

Figure 4:
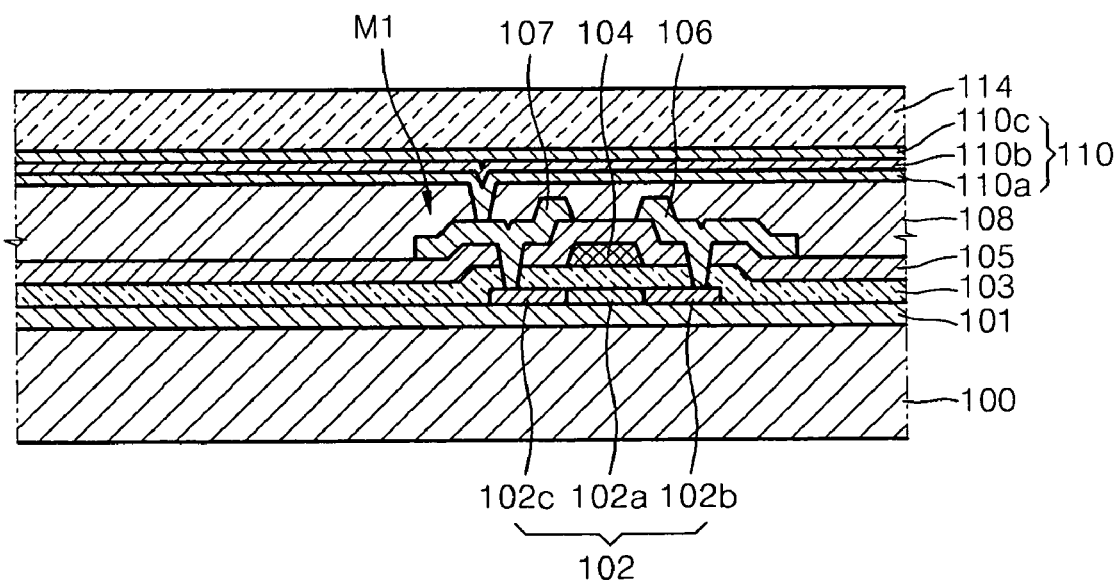
FIGS. 4 through 9 are cross-sectional views illustrating a method of manufacturing an organic light emitting display device according to an embodiment.

FIGS. 4 through 9 are cross-sectional views illustrating a method of manufacturing an organic light emitting display device according to an embodiment. Referring to FIG. 4, a driving TFT M1 is formed over a substrate 100. A passivation film 108 covers the driving TFT M1 and the substrate 100. A pixel electrode layer 110 of an OLED is formed on the passivation film 108. Instead of the driving TFT M1, a pixel circuit including not only the driving TFT M1 but also a switching TFT M2 and a storage capacitor Cst as shown in FIG. 3 may be formed over the substrate 100. The following description will be centered on the driving TFT M1 of the pixel circuit.

In the illustrated embodiment, the substrate 100 is formed of glass. In other embodiments, the substrate 100 may be formed of a plastic material or a metal, such as, SUS or Ti.

A buffer layer 101 may be further formed on an upper surface of the substrate 100. The buffer layer 101 may be formed of an inorganic compound and/or an organic compound, for example, $SiO_x$ ($x \geq 1$) and $SiN_x$ ($x \geq 1$).

After a semiconductor active layer 102 having a predetermined pattern is formed on the buffer layer 101, the semiconductor active layer 102 is buried in a gate insulation layer 103. The semiconductor active layer 102 includes a source region 102b, a drain region 102c, and a channel region 102a formed between the source and drain regions 102a and 102b. The semiconductor active layer 102 is formed by forming an amorphous silicon film on the buffer layer 101, crystallizing the same into a polycrystalline silicon film, and patterning the polycrystalline silicon film. In the embodiment of FIGS. 3 and 4, the driving TFT M1 is a PMOS type. In other embodiments, however, the driving TFT M1 may be of NMOS type. The semiconductor active layer 102 may be formed of an organic semiconductor.

A gate electrode 104 overlapping with the semiconductor active layer 102 and an interlayer insulation layer 105 burying the gate electrode 104 are formed on the upper surface of the gate insulation layer 103.

A contact hole is formed in the interlayer dielectric layer 105 and the gate insulation layer 103 so as to contact a source electrode 106 and a drain electrode 107 formed on the interlayer dielectric layer 105 with the source region 102b and the drain region 102c, respectively. In this way, the driving TFT M1 is formed. The passivation film 108 is formed on the top surface of the driving TFT M1.

Next, a contact hole is formed in the passivation film 108, and a pixel electrode layer 110 is then formed on the passivation film 108. The pixel electrode layer 110 is contacted with the drain electrode 107 of the driving TFT M1 via the contact hole.

The pixel electrode layer 110 may include a first layer 110a, a reflecting layer 110b, and a second layer 110c, which are sequentially formed on the passivation film 108. The first layer 110a and the second layer 110c may be formed of a material having a high work function, for example, a transparent conductor, such as, ITO, IZO, In$_2$O$_3$, or ZnO. The reflecting layer 110b may be formed of a metal having high light reflectance, such as, Ag, Mg, Al, Pt, Pd, Au, Ni, Nd, Ir, Cr, Li, Ca, or a compound of two or more of these materials. In another embodiment, the pixel electrode layer 110 may have a two-layered structure formed of only a reflecting layer and a transparent conductor layer. The pixel electrode layer 110 may have various other layer structures.

After forming the pixel electrode layer 110, a photoresist 114 is coated on the pixel electrode layer 110 to serve as a mask when patterning the pixel electrode layer 110.

Figure 5:
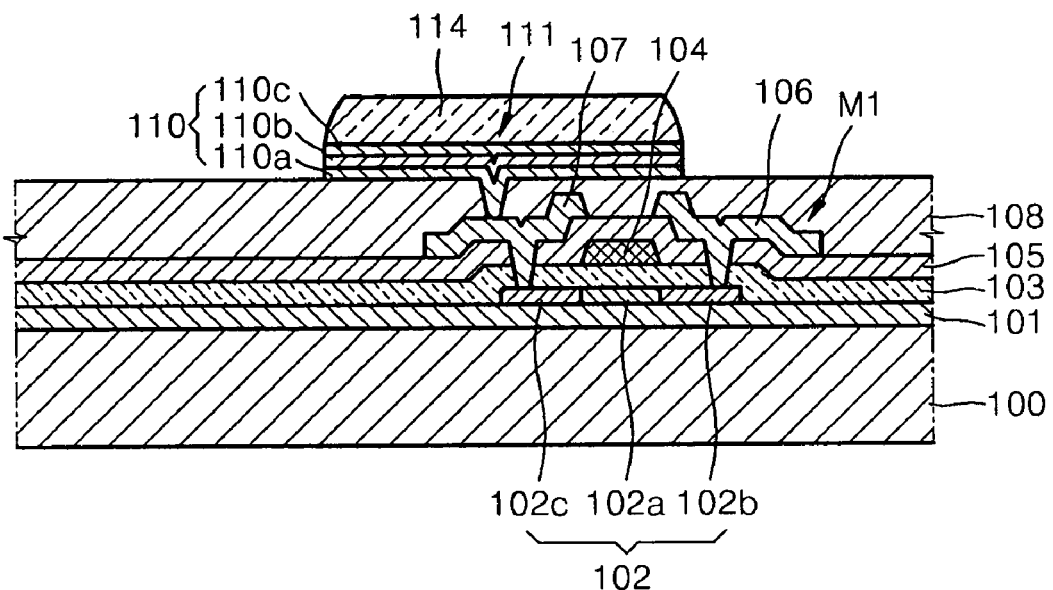

Next, the photoresist 114 is exposed to light using an exposure mask having a predetermined pattern and developed to expose certain portions of the pixel electrode layer 110. The exposed portions of the pixel electrode layer 110 are etched to form pixel electrodes 111 as shown in FIG. 5. The photoresist 114 still exists on the pixel electrodes 111. Accordingly, particles detached from the edges of the reflecting layer 110b when etching the pixel electrode layer 110 are attached to the surface of the remaining photoresist 114. Hence, re-attachment of the particles to the patterned pixel electrodes 111 is prevented. Since these particles are removed simultaneously when the photoresist 114 is removed as will be described later, they are prevented from being re-attached to the pixel electrodes 111.

Figure 6:
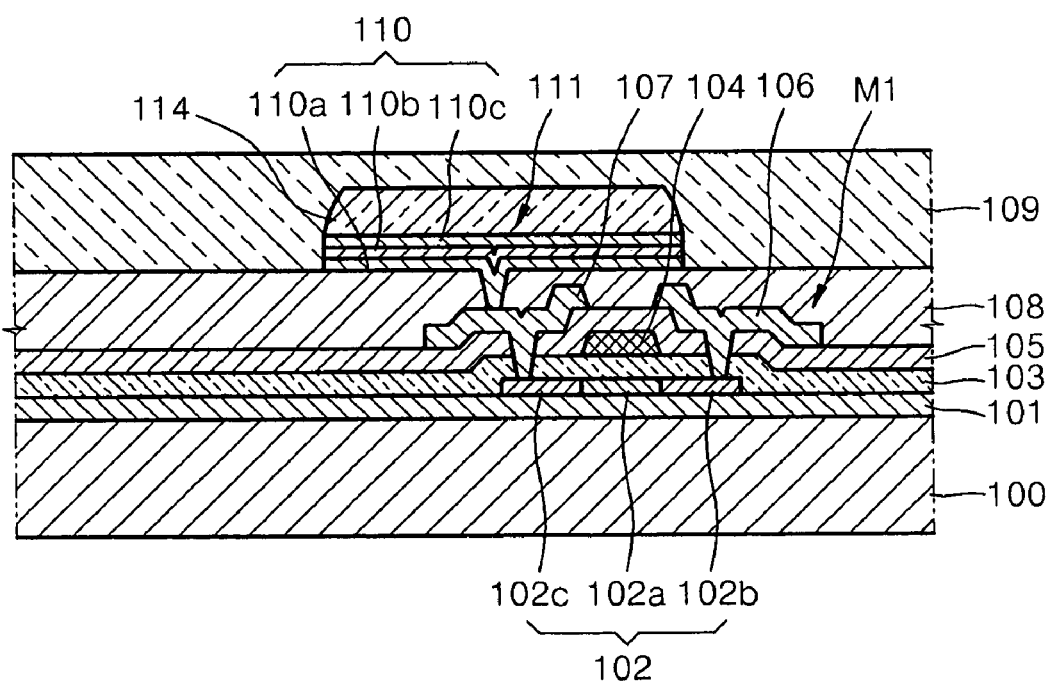

As shown in FIG. 6, a pixel defining film 109 is formed with the photoresist 114 existing on the pixel electrodes 111. The pixel defining layer 109 covers both the passivation film 108 and the photoresist 114. The pixel defining layer 109 may be formed of an organic insulator, an inorganic insulator, or a mixture of these materials. In one embodiment, to achieve planarization, the pixel defining layer 109 is formed of an organic insulator, such as, acryl or BCB.

Figure 7:
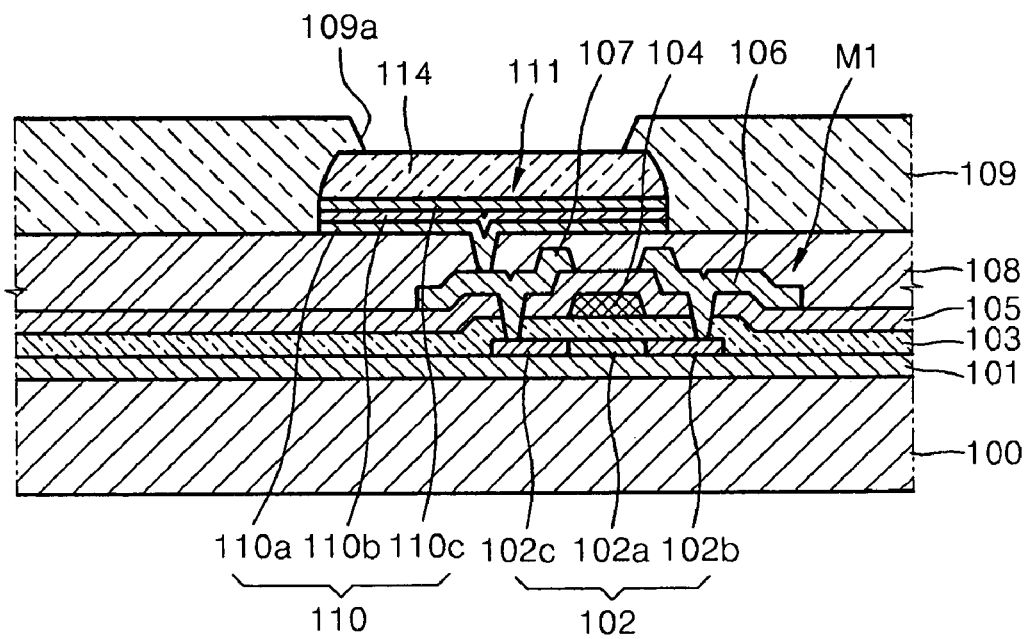
Figure 8:
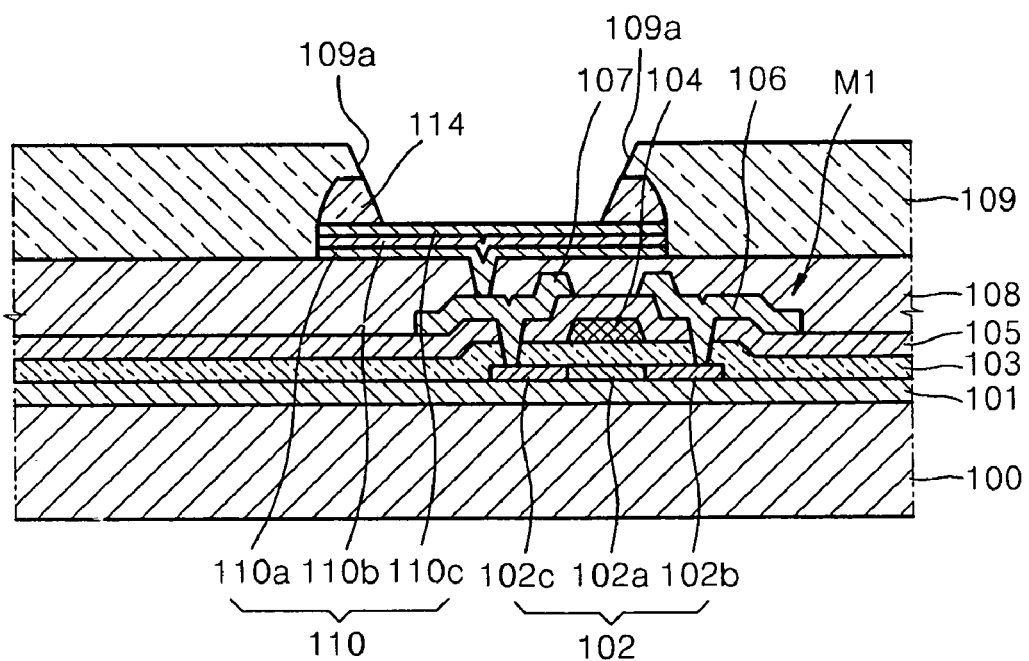

Next, the pixel defining layer 109 is patterned to form an aperture 109a in the pixel defining layer 109, as shown in FIG. 7. A predetermined portion of the photoresist 114 is exposed through the aperture 109a. As shown in FIG. 8, the exposed portion of the photoresist 114 is etched to expose the pixel electrodes 111.

Figure 9:
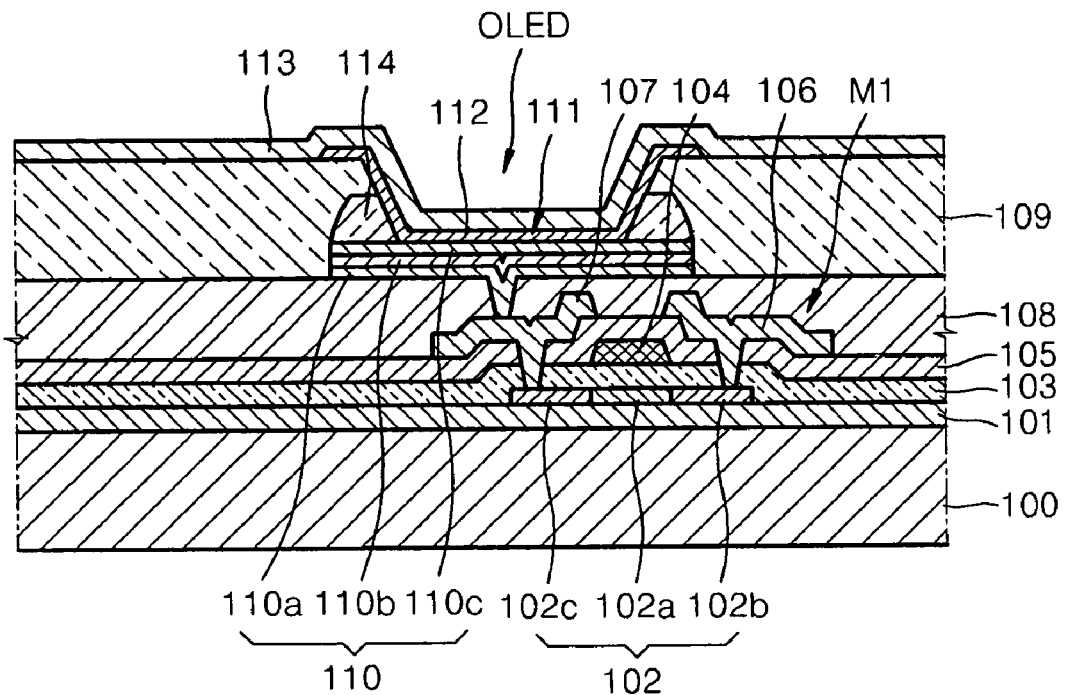

As shown in FIG. 9, an organic light-emitting layer 112 and a facing electrode 113 are sequentially formed over the exposed pixel electrodes 111.

The pixel electrodes 111 serve as anode electrodes, and the facing electrodes 113 serve as cathode electrodes. In another embodiment, the polarity of the facing electrodes 113 may be opposite to that of the pixel electrodes 111. In such an embodiment, the facing electrodes 113 are anode electrodes, and the pixel electrodes 111 are cathode electrodes.

The facing electrodes 113 may be formed of metal having a low work function, such as, Ag, Mg, Al, Pt, Pd, Au, Ni, Nd, Ir, Cr, Li, Ca, or an alloy of two or more of the foregoing. The facing electrodes 113 may be formed of Mg, Ag, Al, etc. In one embodiment, the facing electrode 113 may have thin semi-transparent reflection films to transmit light after optical resonance. Bus lines or bus electrodes may be further formed of a transparent conductor, such as, ITO or IZO, on the facing electrodes 113 so as to lower the sheet resistance of the facing electrodes 113.

The organic light-emitting layer 112 is interposed between the pixel electrodes 111 and the facing electrodes 113. Voltages of different polarities are applied to the organic light-emitting layer 112 so that the organic light-emitting layer 112 emits light.

The organic light-emitting layer 112 may include a small molecular organic film or a polymer organic film. In an embodiment in which a small molecular organic film is used, the organic light-emitting layer 112 may be formed by stacking a hole Injection Layer (HIL), a hole transport layer (HTL), an emission layer (EML), an electron transport layer (ETL), and an electron injection layer (EEL) in a single-layered or multiple layer structure. Examples of a small molecular organic material for the organic light-emitting layer 112 include copper phthalocyanine (CuPc), N,N-di(naphthalene-1-yl)-N,N'-diphenyl-benzidine (NPB), tris-8-hydroxyquinoline aluminum (Alq3), etc. The small molecular organic films may be formed by vacuum deposition. The HIL, the HTL, the ETL, and the EEL may be common layers which are common to blue, green, and red pixels. Hence, these common layers may cover substantially all of the pixels of the organic light emitting display device.

In another embodiment where a polymer organic film is used, the organic light-emitting layer 112 may include an HTL and an EML. In one embodiment, PEDOT is used as a HTL. A polymer organic substance, such as poly-phenylenevinylene (PPV) or polyfluorene, is used as an EML. The HTL and the EML may be formed by, for example, screen printing or ink jet printing.

The organic light-emitting layer 112 is not limited to the aforementioned structures and materials. A skilled artisan will appreciate that the organic light-emitting layer 112 can have various other configurations. The OLED formed in this way is encapsulated and protected from the outside. In the organic light emitting display device, the photoresist 114 still exists on the edges of the pixel electrodes 111.

Figure 10:
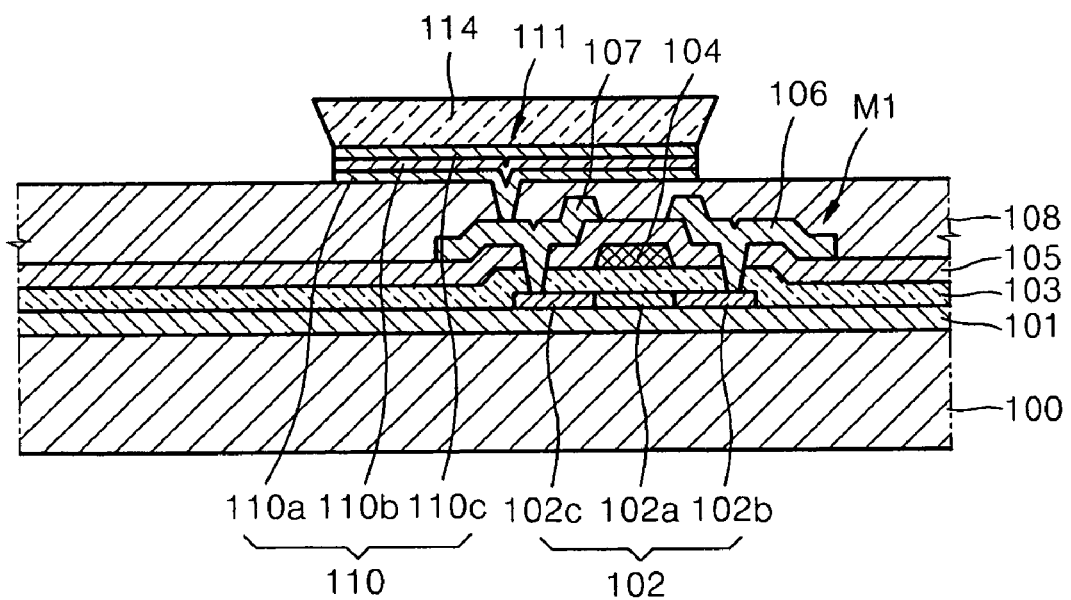
FIGS. 10 through 13 are cross-sectional views illustrating a method of manufacturing an organic light emitting display device according to another embodiment.
Figure 11:
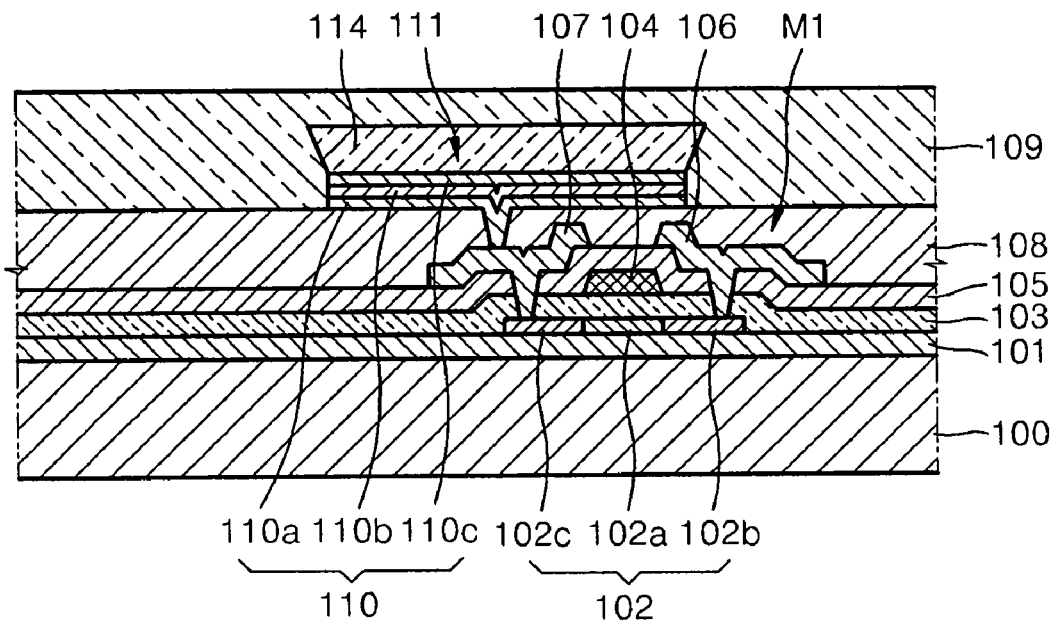

As shown in FIG. 10, the photoresist 114 may be patterned to have a shape reverse to the shape of the photoresist 114 shown in FIGS. 5 through 7. The photoresist 114 of FIG. 10 is formed using any suitable method.

Figure 12:
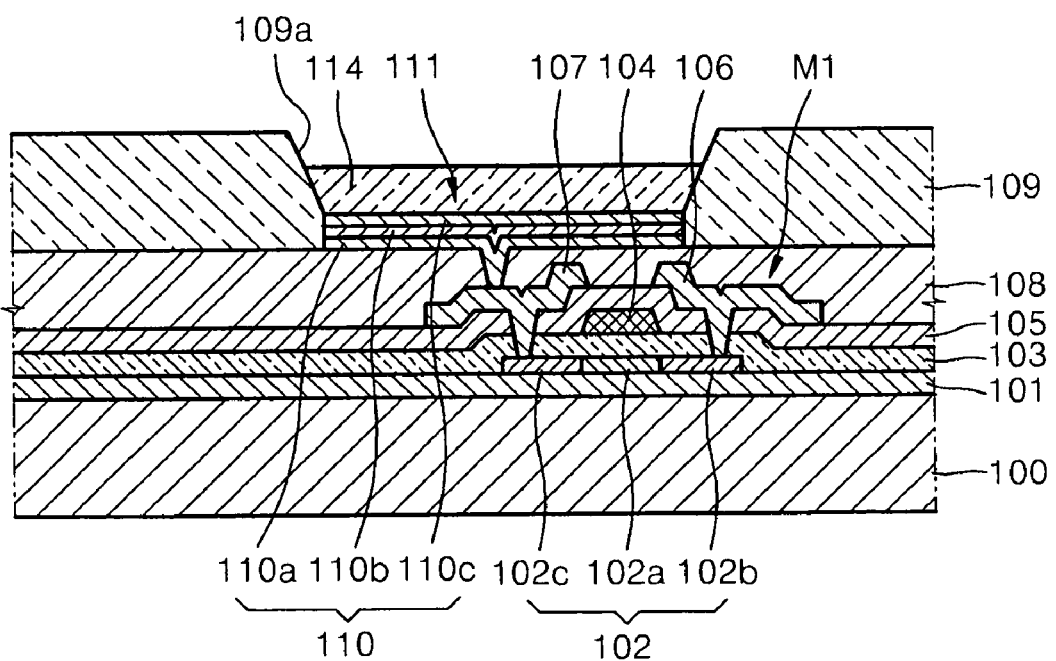

After the photoresist 114 tapering from top to bottom is formed, a pixel defining layer 109 is formed, as shown in FIG. 12. As shown in FIG. 12, an aperture 109a is formed in the pixel defining layer 109. Here, the aperture 109a may taper in conformity with the vertical tapering of the photoresist 114 of FIG. 10.

Figure 13:
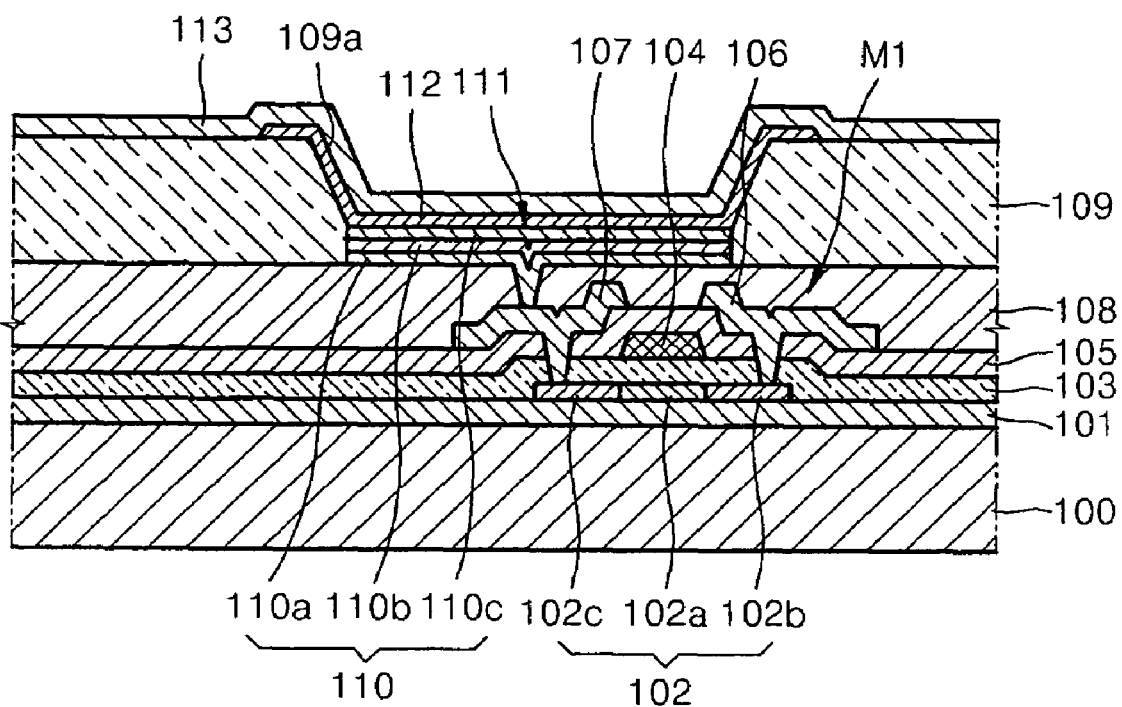

Next, the photoresist 114 exposed through the aperture 109a is removed. Then, when an organic light-emitting layer 112 and a facing electrode 113 are formed as described above, the structure shown in FIG. 13 is obtained. Hence, in the present embodiment, no photoresist exists in the pixel defining layer 109. Because the photoresist is removed after the formation of the pixel defining layer 109, particles of the reflecting layer 110b during etching of the pixel electrodes 111 are not re-attached to the surface of the pixel electrodes 111. Consequently, the number of dark spots generated can be reduced.

Although the above-described embodiments deal with organic light emitting display devices, they may be applied to various types of flat panel displays other than organic light emitting display devices.

According to the embodiments described above, a short between a pixel electrode and a facing electrode caused by particles produced during formation of a reflecting layer or etching of pixel electrodes can be prevented.

While certain aspects of the invention have been shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display device, the method comprising:
    forming a conductive layer over a substrate;
    forming a photoresist layer over the conductive layer;
    patterning the photoresist layer so as to expose at least a portion of the conductive layer;
    etching the exposed portion of the conductive layer through the patterned photoresist layer, thereby defining a first electrode;
    forming an insulating layer over the substrate and the patterned photoresist layer, wherein the patterned photoresist layer remains over the first electrode;
    patterning the insulating layer to expose at least a portion of the patterned photoresist layer remaining over the first electrode;
    removing the at least a portion of the patterned photoresist layer to expose at least a portion of the first electrode;
    forming an organic light emitting layer over the first electrode; and
    forming a second electrode over the organic light emitting layer.

2. The method of claim 1, wherein the conductive layer comprises a reflection film.

3. The method of claim 2, wherein the reflection film is formed of a metallic material.

4. The method of claim 3, wherein the metallic material is selected from the group consisting of Ag, Mg, Al, Pt, Pd, Au, Ni, Nd, Ir, Cr, Li, and Ca.

5. The method of claim 2, wherein the conductive layer further comprises a transparent conductive layer.

6. The method of claim 5, wherein the transparent conductive layer is formed of a material selected from the group consisting of ITO, IZO, $In_2O_3$, and ZnO.

7. The method of claim 1, wherein removing the at least a portion of the patterned photoresist layer comprises leaving another portion of the patterned photoresist layer to remain over the first electrode, the other portion having a top surface covered with the insulating layer.

8. The method of claim 7, wherein the other portion overlies an edge portion of the first electrode.

9. The method of claim 1, wherein patterning the photoresist layer comprises tapering the photoresist layer from top to bottom.

10. The method of claim 9, wherein patterning the insulating layer comprises exposing substantially the entire portion of the patterned photoresist layer remaining over the first electrode.

11. The method of claim 10, wherein removing the at least a portion of the patterned photoresist layer comprises removing substantially the entire portion of the patterned photoresist layer.

12. An organic light emitting display device-made by the method of claim 1.

* * * * *